United States Patent
Ohtani et al.

(10) Patent No.: US 6,545,915 B2
(45) Date of Patent: Apr. 8, 2003

(54) METHOD FOR DRIVING NONVOLATILE SEMICONDUCTOR MEMORY DEVICE

(75) Inventors: Shigehiro Ohtani, Tenri (JP); Kaname Yamano, Ibaraki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/147,321

(22) Filed: May 17, 2002

(65) Prior Publication Data

US 2003/0007389 A1 Jan. 9, 2003

(30) Foreign Application Priority Data

May 17, 2001 (JP) ........................................ 2001-148088

(51) Int. Cl.$^7$ ............................................. G11C 16/04
(52) U.S. Cl. ............................. 365/185.29; 365/185.18; 365/185.13
(58) Field of Search ........................ 365/185.29, 185.18, 365/185.13

(56) References Cited

U.S. PATENT DOCUMENTS 6,256,228 B1 * 7/2001 Hirano .................. 365/185.29
6,307,786 B1 * 10/2001 Ogane .................. 365/185.26

FOREIGN PATENT DOCUMENTS

JP      11-031396      2/1999

* cited by examiner

*Primary Examiner*—Huan Hoang
(74) *Attorney, Agent, or Firm*—Morrison & Foerster LLP

(57) ABSTRACT

In erasing operation, a main bit line discharge signal CPO is set at a voltage of Vss so as for a main bit line discharge transistor CP to put a main bit line BL in a floating state. A substrate signal is set at Vds to charge a local bit line LBL to Vds. A drain select gate signal DSG is set at Vleg (<(Vds+Vth)) which makes a half-conducting state between the main bit line BL and the local bit line LBL. Thereby, the main bit line BL is charged to Vmbl (=Vleg−Vth(ST)) which lowers potential differences between a drain and a source of the select transistor ST and between a drain and a source of the main bit line discharge transistor CP.

3 Claims, 9 Drawing Sheets

METHOD FOR DRIVING NONVOLATILE SEMICONDUCTOR MEMORY DEVICE

BACKGROUND OF THE INVENTION

The present invention relates to a method for driving a nonvolatile semiconductor memory device such as a flash memory that is electrically rewritable.

The flash memory enables high degree of integration as a nonvolatile semiconductor memory device that is capable of data programing and erasing. Thus, many memory cell structures and driving methods of a flash memory have been developed. One of many proposals regarding the memory cell structures is found in Japanese Patent Laid-Open Publication No. JP-A 11-31396. It discloses a memory cell structure that involves injection and pulling-out of electrons (i.e., programing and erasing operations) through a tunnel oxide between a channel region and a floating gate and enables high speed access and high degree of integration, and implements a good endurance property (resistance to deterioration of a memory cell due to programing and erasing operations).

FIG. 3 shows a schematic block diagram of an NOR flash memory for a typical example of such a nonvolatile semiconductor memory device. A memory cell used in the flash memory is a floating-gate MOS (metal oxide semiconductor) field-effect transistor that has a structure as shown in FIG. 4. More particularly, the memory cell is composed of a source 2 and a drain 3 formed on a surface of a semiconductor substrate 1, a channel region formed between the source 2 and the drain 3, and a floating gate 5 and a control gate 7 formed on the channel region. Further, an interlayer insulating film 6 is provided between the control gate 7 and the floating gate 5, and a tunnel oxide 4 is provided between the floating gate 5 and the channel region.

As shown in FIG. 3, the flash memory is composed of a high voltage pump (high voltage generating circuit) 11, a negative voltage pump (negative voltage generating circuit) 12, regulator circuits 13–15, a memory cell array 16, a column decoder 17, a row decoder 18, an erasing circuit 19, a drain select gate (sg) circuit 20, and a source select gate (sg) circuit 21.

The high voltage pump 11 outputs a positive voltage Vpp-Veg raised based on a voltage Vcc. On the other hand, the negative voltage pump 12 outputs a negative voltage Vneg raised based on the voltage Vcc. Consequently, the regulator circuit 13 outputs a voltage Vds based on the positive voltage Vpp from the high voltage pump 11, the regulator circuit 14 outputs a voltage Vinh based on the positive voltage Vpp, and the regulator circuit 15 outputs a voltage Vpd based on the positive voltage Vpp.

The memory cell array 16 is made up of a plurality of memory cells disposed in a matrix configuration though only one memory cell is shown in FIG. 3. The column decoder 17 selects a bit line of the memory cell array 16 based on the voltage Vds from the regulator circuit 13 and the voltage Vinh from the regulator circuit 14. The row decoder 18 selects a word line of the memory cell array 16 based on the positive voltage Vpp from the high voltage pump 11 and the negative voltage Vneg from the negative voltage pump 12. The erasing circuit 19 performs erase control of memory cells based on the voltage Vds from the regulator circuit 13.

The drain sg circuit 20 outputs a signal to a drain select gate signal line DSG based on the positive voltage Vpp from the high voltage pump 11 and the voltage Vpd from the regulator circuit 15. The source sg circuit 21 outputs a signal to a source select gate signal line SSG based on the positive voltage Vpp from the high voltage pump 11.

FIG. 5 is a circuit diagram showing a specific structure of the regulator circuits 13, 14, and 15. The regulator circuits 13, 14, and 15 are composed of an inverting amplifier OP, a transistor Q1, a resistance R1 and a resistance R2.

A reference voltage is inputted to a non inverting input terminal of the inverting amplifier OP. An output terminal of the inverting amplifier OP is connected to a gate of the transistor Q1. The voltage Vpp is inputted to a drain of the transistor Q1. A source of the transistor Q1 is connected to one end of the resistance R1. The other end of the resistance R1 is connected to an inverting input terminal of the inverting amplifier OP and to one end of the resistance R2. The other end of the resistance R2 is connected to a ground.

By setting appropriate values of resistance for the resistance R1 and the resistance R2, there are outputted from the source of the transistor Q1, a voltage Vds in the case of the regulator circuit 13, a voltage Vinh in the case of the regulator circuit 14, and a voltage Vpd in the case of regulator circuit 15.

In the above-structured flash memory, a voltage necessary for programing and erasing operations is obtained from the high voltage pump 11, the negative voltage pump 12, and the regulator circuits 13, 14, and 15. More particularly, the high voltage pump 11 generates a voltage Vpp in programing operation, a voltage Vbias (approx. 5V) in reading operation, and a voltage Veg in erasing operation. The negative voltage pump 12 does not operate in programing operation where negative voltage is not necessary, but generates a voltage Vneg in erasing operation.

Table 1 shows voltages applied to each electrode and a semiconductor substrate of a memory cell in programing (writing), erasing and reading operations.

TABLE 1

|  | Gate | Drain | Source | Substrate |
| --- | --- | --- | --- | --- |
| Programing | Vpp | Vss/Vinh | Vss/Vinh | Vss |
| Erasing | Vneg | Vds(F) | Vds(F) | Vds |
| Reading | Vcc | Vbias | Vss | Vss |

Vss/Vinh herein indicates that a voltage Vss is applied in programing of data "0", and a voltage Vinh is applied in programing of data "1". Vds(F) indicates that a voltage Vds is applied or that a floating state (F) is set.

FIG. 6 shows a state of writing to a memory cell of a flash memory having the structure shown in FIG. 4. In the application voltage conditions of programing operation, as shown in Table 1, the voltage Vpp (for example +15V: a control gate voltage in programing operation) is applied to the control gate 7, and the voltage Vss (for example 0V: reference voltage) is applied to the source 2, the drain 3 and the semiconductor substrate 1. This induces electrons in a channel region c, which in turn generates high electric fields between the floating gate 5 and the channel region c. As a result, electrons are injected into the floating gate 5 through the tunnel oxide 4 (see FIG. 4).

FIG. 7 shows an erase state. In erasing operation, the voltage Vneg (for example −10V: a control gate negative voltage in erasing operation) is applied to the control gate 7. The source 2 and the drain 3 are set to be in a floating state or applied by the voltage Vds (for example 0V to +6V). The voltage Vds is applied to the semiconductor substrate 1. Those conditions pull electrons from the floating gate 5 to the channel region c through the tunnel oxide 4.

FIG. 8 shows a distribution of threshold voltages in the erasing and writing states of a memory cell. The horizontal axis shows threshold voltages Vth of the memory cells, while the vertical axis shows number of the memory cells having respective threshold voltages Vth.

FIG. 9 shows a detailed structure of the memory cell array 16 shown in FIG. 3. In FIG. 9, local bit lines LBL0, LBL1, . . . , LBLm are connected in common to drains of memory cells M00 to Mn0, M01 to Mn1, . . . , M0m to Mnm existing in the same rows, respectively. Also, the local bit lines LBL0, LBL1, . . . , LBLm are connected to main bit lines BL0 to BLm respectively, through select transistors ST10, ST11, . . . , ST1m as the first MOS transistor. Local source lines LSL0, LSL1, . . . , LSLm are connected in common to sources of the memory cells M00 to Mn0, M01 to Mn1, . . . , M0m to Mnm existing in the same rows, respectively. Also, the local source lines LSL0, LSL1, . . . , LSLm are connected to a common source line CSL respectively, through select transistors ST20, ST21, . . . , ST2m as the second MOS transistor. Further, word lines WL0, WL1, . . . , WLn are connected in common to control gates of the memory cells M00 to M0m, M10 to M1m, . . . , Mn0 to Mnm existing in the same columns, respectively.

Each gate of the select transistors ST10, ST11, . . . , ST1m are connected in common to a drain select gate signal line DSG. Each gate of the select transistors ST20, ST21, . . . , ST2m are connected in common to a source select gate signal line SSG. The main bit lines BL0 to BLm are connected to main bit line discharge transistors CP0 to CPm for discharging. Each gate of the main bit line discharge transistors CP0 to CPm are connected in common to a main bit line discharge signal line CPO.

Table 2 shows voltages applied to each signal line of the memory cell array 16 shown in FIG. 9 and to the semiconductor substrate in programing, erasing and reading operations.

TABLE 2

|  | Programing | Erasing | Reading |
| --- | --- | --- | --- |
| WL (Selected) | Vpp | Vneg | Vcc |
| WL (Unselected) | Vss | — | Vss |
| BL (Data 0) | Vss | Vds(F) | Vbias |
| BL (Data 1) | Vinh | — | — |
| DSG | Vpd | Veg | Vcc |
| SSG | Vss | Veg | Vcc |
| Semiconductor substrate | Vss | Vds | Vss |

FIG. 10 shows a timing chart of programing sequence. Following description discusses programing operation with reference to FIG. 10. It is noted that prior to programing operation, a memory cell M is erased and a threshold voltage of the memory cell M is in a low state (data "1").

First, upon application of the voltage Vss to the source select gate signal line SSG, the select transistors ST20 to ST2m are set at OFF, so that the common source line CSL and the local source lines LSL0 to LSLm are electrically separated, thereby putting the sources of all the memory cells M00 to Mnm in a floating state. Further, upon application of the voltage Vpd (>Vinh+Vth) (Vth: a threshold voltage of the select transistors ST10 to ST1m, Vinh: a later-described write inhibiting voltage) to the drain select gate signal line DSG, the select transistors ST10 to ST1m are set at ON so that the local bit lines LBL0 to LBLm are each connected to the main bit lines BL0 to BLm.

Next, a specified voltage is applied to the main bit lines BL0 to BLm depending on a write value. More specifically, the voltage Vss (for example 0V) is applied to a main bit line BL connected to the memory cell M in the case of programing data "0" by injecting electrons from the channel region c of a memory cell M into the floating gate. In the case of programing data "1" onto a memory cell M, a write inhibiting voltage Vinh (a relatively high voltage, for example +6V) is applied to the main bit line BL connected to the memory cell M. Since application of the voltage Vpp to the word line WL induces electrons in the channel region C to short-circuit the drain 3 and the source 2, the write inhibiting voltage Vinh is applied from the main bit line BL through the drain 3 to the channel region c and the source 2 to prevent electrons from being injected from the channel region c side into the floating gate 5. The programing of data "1" herein refers to the operation of holding the erase state.

Next, the voltage Vpp is applied to one word line WL (a word line WL connected to the memory cell M onto which data "0" is to be written) selected out of the word lines WL (WL0 to WLn) for time tw. This induces electrons in the channel region c of the memory cell M connected to the selected word line WL, so that the drain 3 and the source 2 are short-circuited. Among the memory cells M connected to the selected word line WL, the memory cell M where the voltage Vss (for example 0V) is applied to the main bit line BL as stated above has a drain potential equal to the voltage Vss through the main bit line BL and the local bit line LBL. A source potential thereof also becomes equal to the voltage Vss through the channel region c. Therefore, high electric fields generates between the floating gate 5 and the source 2, between the floating gate 5 and the drain 3 and between the floating gate 5 and the channel region c. Then, electrons are injected from the source 2, the drain 3 and the channel region c into the floating gate 5, thereby increasing a threshold voltage of the memory cell M. Consequently, data "0" is written.

In the channel region c of a memory cell M which is connected to the selected word line WL and onto which data "1" is to be written, electrons are also induced. Thereby, the drain 3 and the source 2 thereof are short-circuited as in the case with the memory cell M onto which data "0" is written. Therefore, electrical potentials of the source 2 as well as the drain 3 of the memory cell M become equal to the write inhibiting voltage Vinh (Vinh>Vss) applied to the main bit line BL. As a result, electric fields between the channel region c and the floating gate 5 are alleviated. Therefore electrons are not injected into the floating gate 5. This keeps the threshold voltage of the memory cell M low, and holds write data in a state of "1".

For erasing data written onto each of the memory cells M, batch erase in the memory cell array 16 is executed. The batch erase is available in two methods as shown in FIGS. 11 and 12. Following description discusses first erasing sequence shown in FIG. 11.

First, the voltage Vss is applied to the main bit line discharge signal line CPO. This puts the main bit line discharge transistors CP0 to CPm in an OFF state, which puts the main bit lines BL in a floating state. Next, the voltage Veg (for example +8V) is applied to the source select gate signal line SSG and the drain select gate signal line DSG, where Veg>Vds+Vth (Vth: a threshold voltage of the select transistors ST10 to ST1m, ST20 to ST2m). Consequently, the select transistors ST10 to ST1m and ST20 to ST2m are put in an ON state even when the voltage Vds is applied to the main bit lines BL and the common source line CSL in later operation. This is because voltage larger than the threshold value Vth is generated between each source and gate of the select transistors ST10 to ST1m, ST20 to ST2m.

Thus, the common source line CSL and the local source lines LSL0 to LSLm are connected, and also the main bit lines BL0 to BLm and the local bit lines LBL0 to LBLm are connected.

Next, the voltage Vds (for example 0V to +6V) is applied to the semiconductor substrate 1 (shown as "SUB" in FIG. 11), main bit lines BL and the common source line CSL. Also, the negative voltage Vneg (for example −8V) is applied to all the word lines WL in the memory cell array 16. As a result, though the channel region c is not formed in all the memory cells M00 to Mnm, potentials of the source 2 and the drain 3 thereof becomes close to the voltage Vds. Consequently, there are generated high electric fields conforming to potential difference (Vds−Vneg) generated between the source 2 and the floating gate 5, between the channel region c and the floating gate 5, and between the drain 3 and the floating gate 5 in all the memory cells M00 to Mnm. As soon as electrons are pulled from the floating gate 5, holes inside the channel region c are injected into the tunnel oxide 4 and the floating gate 5. Thereby, threshold voltages of all the memory cells M00 to Mnm are decreased. In other words, data in all the memory cells M00 to Mnm are erased.

In this operation, the source 2 may be put in a floating state, and electron may be pulled only between the channel region c and the floating gate 5 and between the drain 3 and the floating gate 5.

Next, description will be given of second erasing sequence shown in FIG. 12. First, the voltage Vcc is applied to the main bit line discharge signal line CPO. This puts the main bit line discharge transistors CP0 to CPm in an ON state and earths the main bit lines BL for discharging. Further, the voltage Vss is applied to the source select gate signal line SSG and the drain select gate signal line DSG. Consequently, the select transistors ST10 to ST1m, ST20 to ST2m are all put in an OFF state, and the local bit lines LBL0 to LBLm and the local source lines LSL0 to LSLm are put in a floating state. Next, the voltage Vds is applied to the semiconductor substrate 1 (shown as "SUB" in FIG. 12), while a voltage of the common source line CSL is kept to be Vss, and the voltage Vneg is applied to the word line WL for erasing time tE. Consequently, there are generated high electric fields between the channel region c and the floating gate 5 in all the memory cells M00 to Mnm. As soon as electrons are pulled from the floating gate 5, holes inside the channel region c are injected into the tunnel oxide 4 and the floating gate 5, which decreases threshold voltage of all the memory cells M00 to Mnm.

In the first erasing sequence, when programing and erasing is executed, injection and discharge of electrons are executed between the source 2 and the floating gate 5, between the channel region c and the floating gate 5 and between the drain 3 and the floating gate 5. Therefore, a trap causing decreased reliability is less prone to occur in the tunnel oxide 4 next to the drain 3 and the source 2.

In the second erasing sequence, when erasing is executed, the source 2 and the drain 3 are in a floating state. Therefore, a trap may occur in the tunnel oxide 4 next to the drain 3 and the source 2. However, in the second erasing sequence, compared to the first erasing sequence, generation of voltage as high as the voltage Veg is not necessary. This provides an advantage that voltage generated by the high voltage pump 11 can be set lower, thereby decreasing a layout area of the high voltage pump 11.

However, the above stated conventional methods for driving the nonvolatile semiconductor memory device have following problems.

In the case of the first erasing sequence, first, the voltage Vss is applied to the main bit line discharge signal line CPO. This puts the main bit line discharge transistor CP in an OFF state to put the main bit line BL in a floating state. Then, the voltage Veg (>(Vds+Vth(ST))) is applied to the source select gate signal line SSG and the drain select gate signal line DSG. Consequently, all the select transistors ST1, ST2 are set at ON. Thereby, the common source line CSL and the local source line LSL are connected, and the main bit line BL and the local bit line LBL are connected. Next, the voltage Vds is applied to the semiconductor substrate SUB, the main bit line BL and the common source line CSL.

Accordingly, as illustrated in FIG. 13 showing a main part extracted from FIG. 9, a voltage Vmbl of the main bit line BL is equal to Vds, which makes potential difference between the drain and the source of the main bit line discharge transistor CP as high as Vds. Generally, the transistor CP is given a shorter gate length for decreasing resistance in passing of current, so as to implement high speed and appropriate discharge from the main bit line BL when current passes.

However, the shorter gate length lowers withstand-voltage between the source and the drain of the transistor CP, and therefore, the transistor CP becomes more susceptible to stress. Also, it is highly possible that high potential difference if generated between the drain and the source causes destruction of elements and the like due to punch-through and avalanche breakdown, thereby affecting reliability.

In the case of the second erasing sequence, the voltage Vcc is applied to the main bit line discharge signal line CPO. This puts the main bit line discharge transistor CP in an ON state and earths the main bit line BL for discharging. Further, the voltage Vss is applied to the source select gate signal line SSG and the drain select gate signal line DSG. Consequently, all the select transistors ST1, ST2 are set at OFF, and the local bit line LBL and the local source line LSL are put in a floating state. Next, the voltage Vds is applied to the semiconductor substrate SUB, voltage of the common source line CSL is held to be Vss, and the voltage Vneg is applied to the word line WL for erasing time tE.

In this case, current flows from the semiconductor substrate 1 formed in a P type to the drain 3 formed in an N type due to p-n forward bias, so that the local bit line LBL in a floating state is charged. As a result, voltage of the local bit line LBL connected to the drain 3 are raised up to Vds. Similarly, p-n forward bias current flows from the semiconductor substrate 1 formed in a P type to the source 2 formed in an N type, so that the local source line LSL is charged up to the voltage Vds.

Accordingly, as illustrated in FIG. 14 showing a main part extracted from FIG. 9, potential difference between the drain and the source in the select transistor ST1 becomes as high as Vds. Similarly, potential difference between the drain and the source in the select transistor ST2 becomes as high as Vds because the local source line LSL has the voltage Vds and the common source line CSL has the voltage Vss. As in the case of the main bit line discharge transistor CP, the select transistors ST1, ST2 require decreased resistance in passing of current so as to perform high speed and appropriate supply of voltage from the main bit line BL to the local bit line LBL and from the common source line CSL to the local source line LSL when current passes. Therefore, a gate length thereof is shortened for decreasing resistance in passing of current.

However, the shorter gate length lowers withstand-voltage between the source and the drain in transistors ST1, ST2, and therefore, the transistors ST1, ST2 become more susceptible to stress. Also, it is highly possible that high potential difference if generated between the drain and the source causes destruction of elements and the like due to punch-through and avalanche breakdown, thereby affecting reliability.

SUMMARY OF THE INVENTION

Accordingly, it is an object of the present invention to provide a method for driving a nonvolatile semiconductor memory device, which makes it possible to reduce stress exerted on the main bit line discharge transistor CP and the select transistors ST1, ST2 in erasing operation so as to increase reliability of the nonvolatile semiconductor memory device.

In order to accomplish the above object, the present invention provides a method for driving a nonvolatile semiconductor memory device having:

a memory cell array where memory cells are disposed in a matrix configuration, the memory cell composed of a floating-gate metal oxide semiconductor transistor including: a source and a drain formed on a surface of a semiconductor substrate; a floating gate formed on the source, the drain and a channel region between the source and the drain through a tunnel oxide; and a control gate formed on the interlayer insulating film through an interlayer insulating film, a word line shared for connecting control gates of the memory cells in a same row;

a local bit line shared for connecting drains of the memory cells in a same column;

a main bit line connected to the local bit line through a first metal oxide semiconductor transistor;

a local source line shared for connecting sources of the memory cells in a same column;

a common source line connected to the local source line through a second metal oxide semiconductor transistor; and a power line connected to the main bit line through a third metal oxide semiconductor transistor for supplying reference potential, the method, when erasing operation is executed, comprising the steps of:

setting the third metal oxide semiconductor transistor to an OFF state for putting the main bit line in a floating state;

applying a first voltage to the semiconductor substrate so as to charge the local bit line to the first voltage;

setting the first metal oxide semiconductor transistor to a half-conducting state for making a voltage between a drain and a source of each of the first and third metal oxide semiconductor transistors lower than the first voltage; and applying a second voltage to the control gate through the word line so as to discharge electrons from the floating gate to the channel region through the tunnel oxide.

According to the above structure, the local bit line connected to the drain of the memory cell is charged by applying the first voltage to the semiconductor substrate of the memory cell. Through the first MOS transistor in the half-conducting state, the main bit line connected to the source of the first MOS transistor is charged. Specifically, the voltage of the main bit line is raised up to difference between a gate voltage of the first MOS transistor and a threshold voltage thereof.

Consequently, potential difference between the local bit line and the main bit line, that is, potential difference between the drain and the source of the first MOS transistor becomes lower than that in the case of discharging the main bit line like the conventional second erasing sequence. Further, potential difference between the main bit line and the reference potential voltage, that is, potential difference between the drain and the source of the third MOS transistor becomes lower than that in the case of applying the first voltage equal to the voltage applied to the semiconductor substrate to the main bit line like the conventional first erasing sequence. Thus, less stress exerts on the first MO transistor as a select transistor and the third MOS transistor as a main bit line discharge transistor.

According to one embodiment, the step of setting the first metal oxide semiconductor transistor to the half-conducting state includes applying a third voltage to a gate of the first metal oxide semiconductor transistor to make the voltage between the drain and the source of the first metal oxide semiconductor transistor equal to or lower than a withstand voltage of the first metal oxide semiconductor transistor, and to make the voltage between the drain and the source of the third metal oxide semiconductor transistor equal to or lower than a withstand voltage of the third metal oxide semiconductor transistor.

As described above, voltage of the main bit line is determined by the gate voltage and the threshold voltage of the first MOS transistor. Therefore, when the third voltage i.e. the gate voltage of the first MOS transistor is appropriately selected, it is possible to make voltage between the drain and the source of the first and third MOS transistors equal to or lower than the withstand voltage of the first and third MOS transistors.

In one embodiment, the third voltage is higher than a voltage obtained by adding a threshold voltage of the first metal oxide semiconductor transistor to a voltage of the local bit line and further by subtracting the withstand voltage of the first metal oxide semiconductor transistor therefrom, and is lower than a voltage obtained by adding the threshold voltage of the first metal oxide semiconductor transistor to the withstand voltage of the third metal oxide semiconductor transistor.

According to the embodiment, the third voltage is set higher than "voltage of the local bit line+threshold voltage of the first MOS transistor−withstand voltage of the first MOS transistor", so that the voltage between the drain and the source of the first MOS transistor becomes lower than the withstand voltage of the first MOS transistor. Further, the third voltage is set lower than "withstand voltage of the third MOS transistor+threshold voltage of the first MOS transistor", so that the voltage between the drain and the source of the third MOS transistor becomes lower than the withstand voltage of the third MOS transistor. Thus, reliability of the nonvolatile semiconductor memory device can be increased.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAIDED DESCRIPTION OF THE PREFERRED EMBODIMENTS

Hereinbelow, detailed description will be given of embodiments of the present invention with reference to accompanying drawings.

Figure 1:
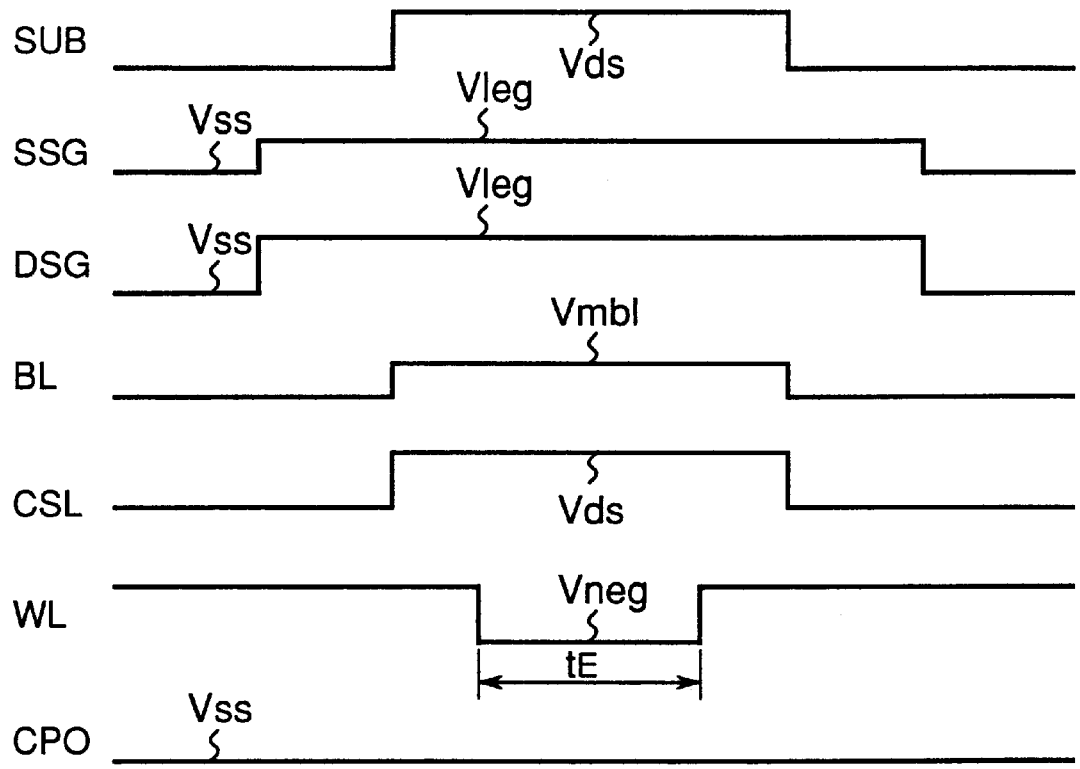
FIG. 1 is a timing chart showing erasing sequence in a method for driving a nonvolatile semiconductor memory device according to the present invention.

FIG. 1 is a timing chart showing erasing sequence in a method for driving a nonvolatile semiconductor memory device according to the present invention. The nonvolatile semiconductor memory device described in the present embodiment is an NOR-type flash memory having a structure basically identical to that shown in FIG. 3.

Figure 9:
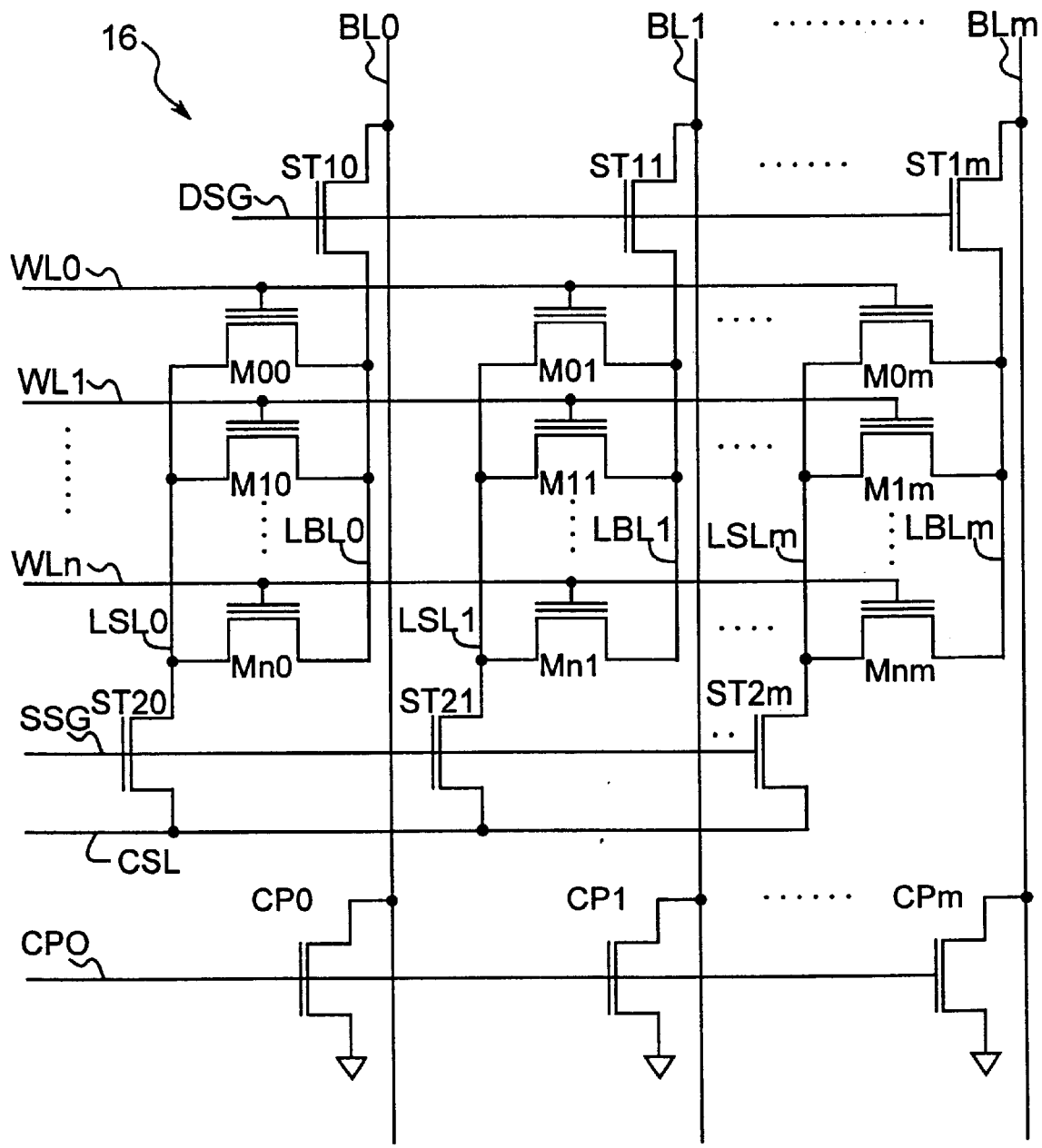
FIG. 9 is a view showing a specific structure of the memory cell array shown in FIG. 3.
Figure 10:
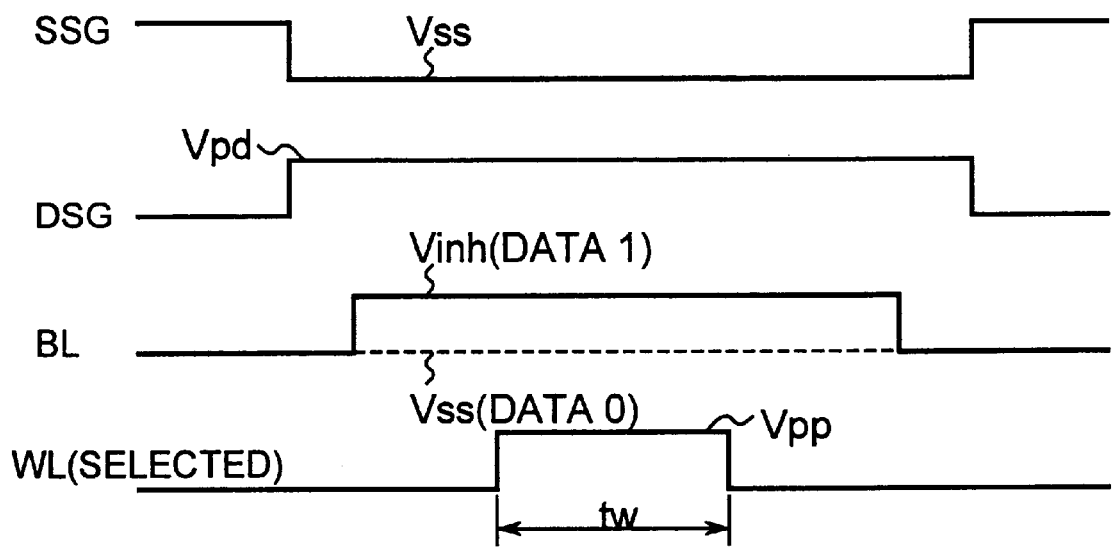
FIG. 10 is a timing chart showing erasing sequence of the memory cell array shown in FIG. 9.
Figure 11:
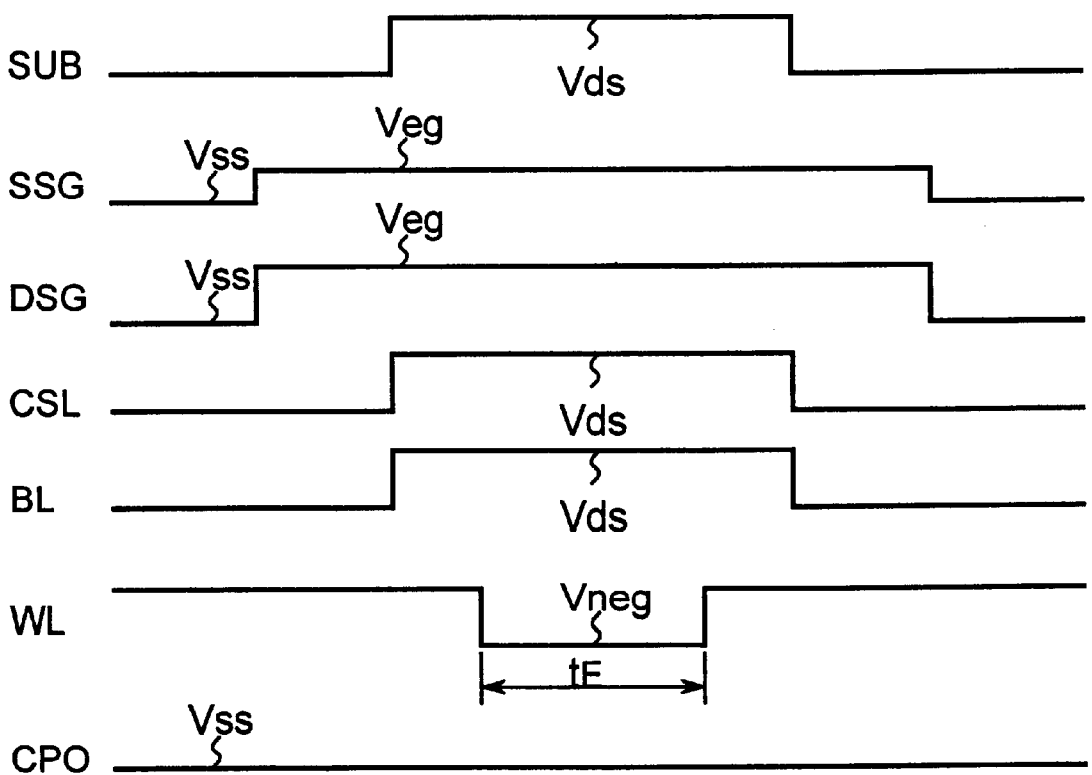
FIG. 11 is a timing chart showing conventional erasing sequence of the memory cell array shown in FIG. 9.
Figure 12:
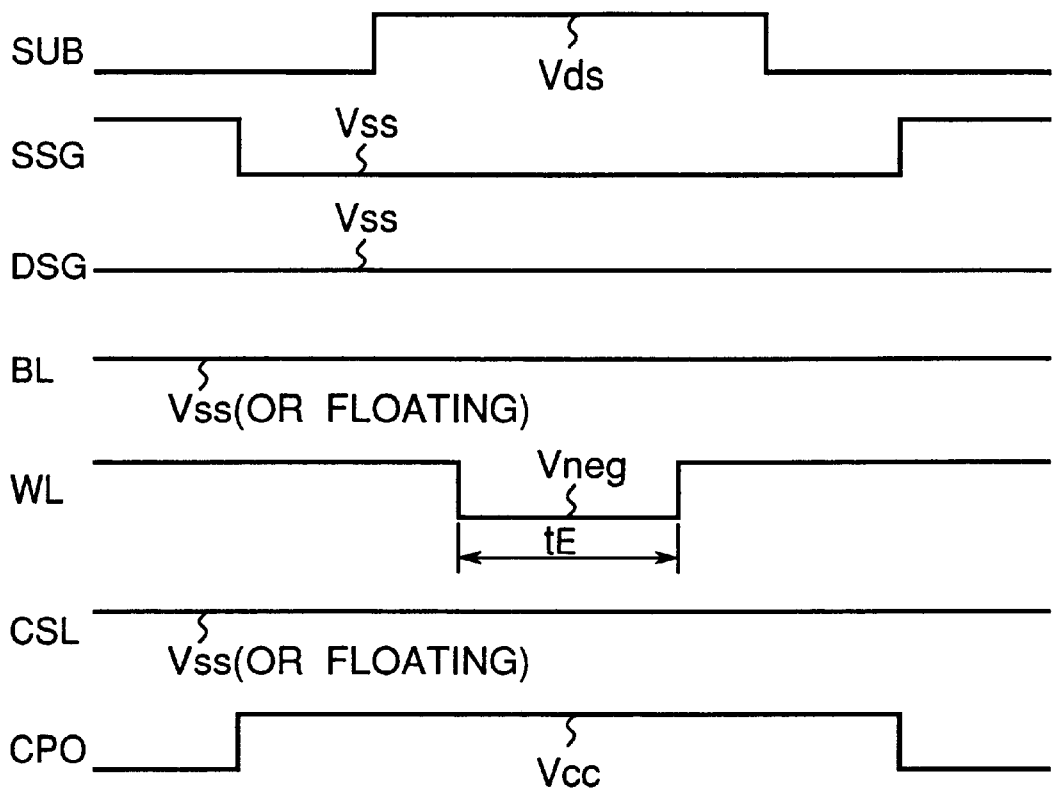
FIG. 12 is a timing chart showing conventional erasing sequence different from that of FIG. 11.
Figure 13:
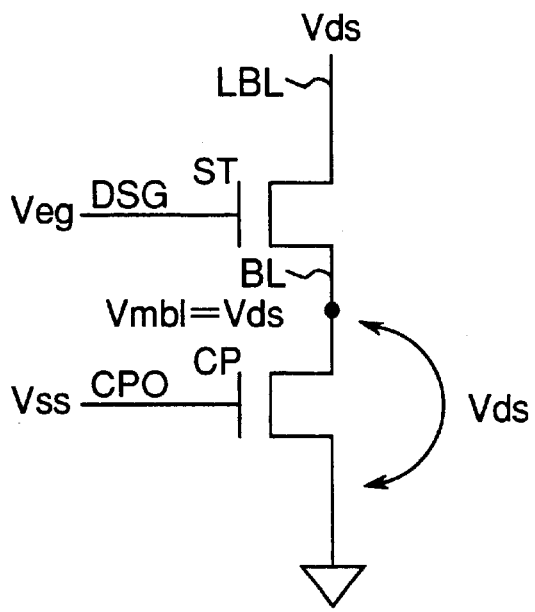
FIG. 13 is a view showing main part of the memory cell array shown in FIG. 9 with respect to the erasing sequence shown in FIG. 11.
Figure 14:
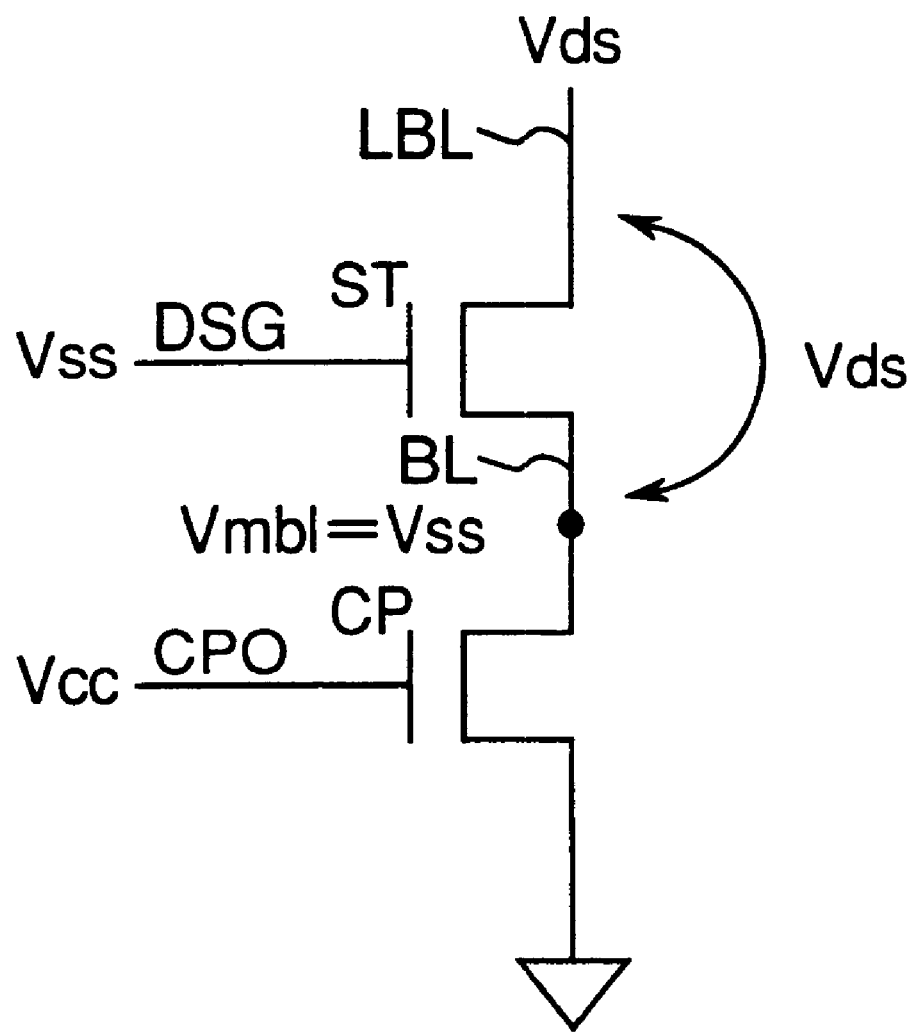
FIG. 14 is a view showing main part of the memory cell array shown in FIG. 9 with respect to the erasing sequence shown in FIG. 12.

A structure of a memory cell array composing the memory is identical to the memory cell array 16 shown in FIG. 9. Also, a structure of a memory cell composing the memory cell array is identical to the memory cell M shown in FIG. 4.

Following description of the present embodiment will be made also with reference to FIGS. 3, 9 and 4. Component members having the same functions as in the nonvolatile semiconductor memory device shown in FIGS. 3, 4 and 9 are hereinafter designated by the same reference numerals and their detailed explanations are omitted.

Figure 3:
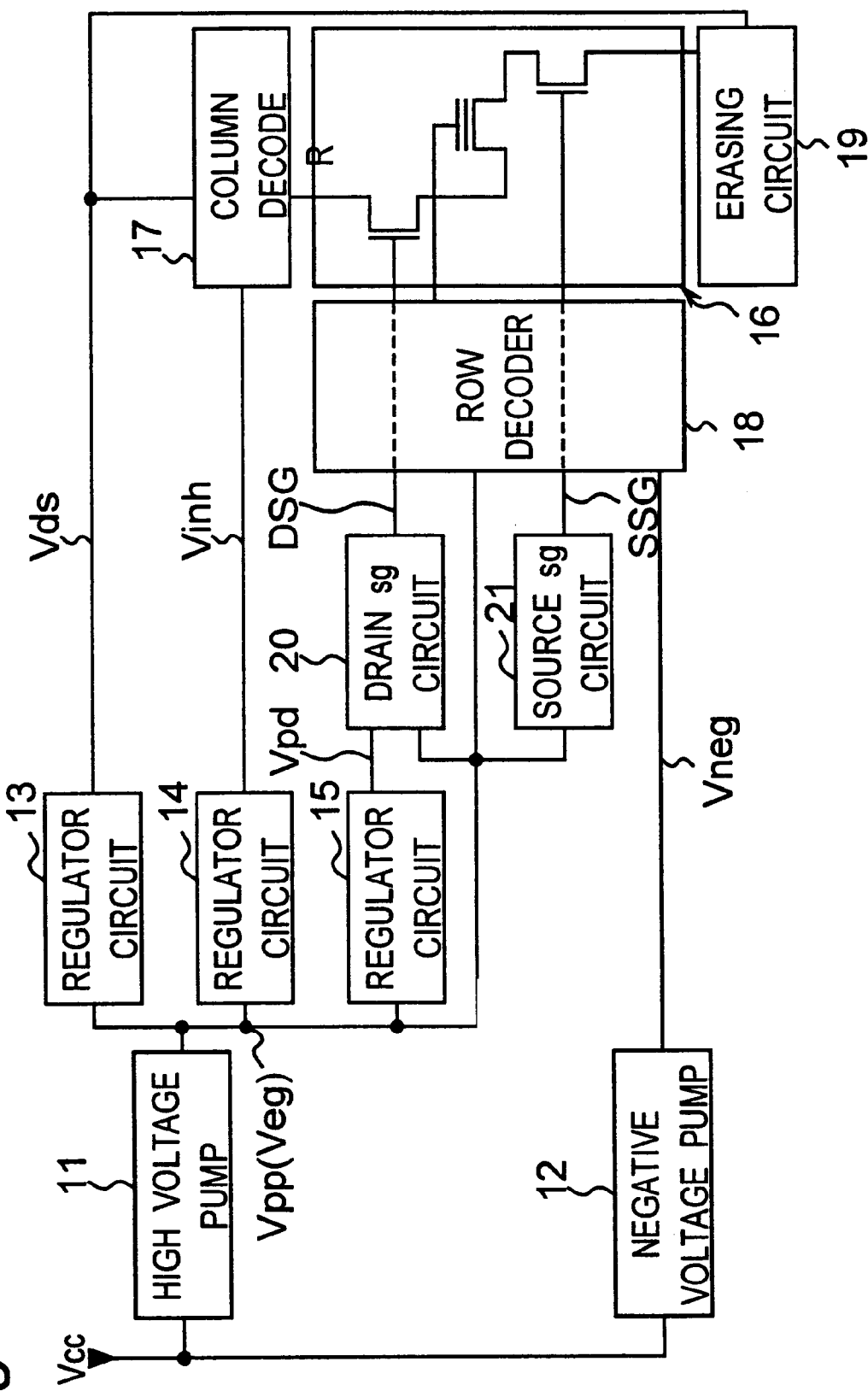
FIG. 3 is a schematic block diagram of a NOR flash memory.
Figure 4:
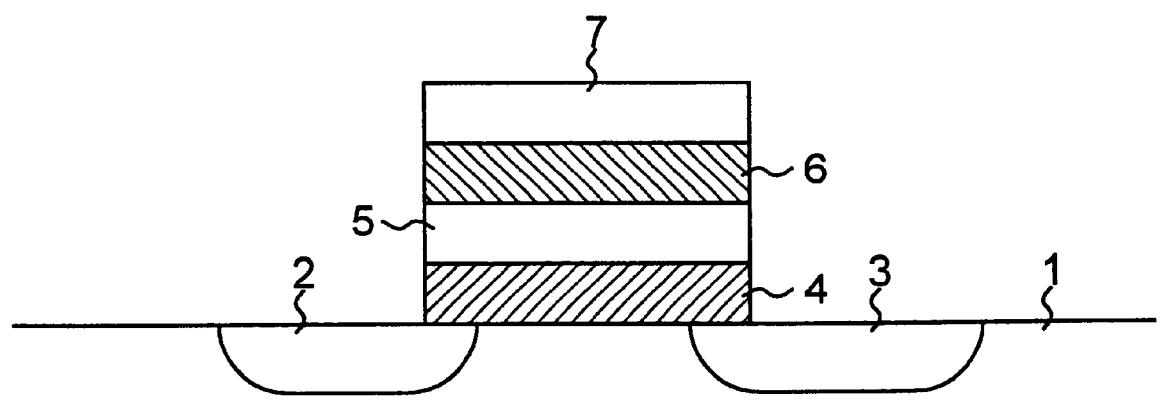
FIG. 4 is a view showing a cross sectional structure of a memory cell composing a memory cell array shown in FIG. 3.
Figure 5:
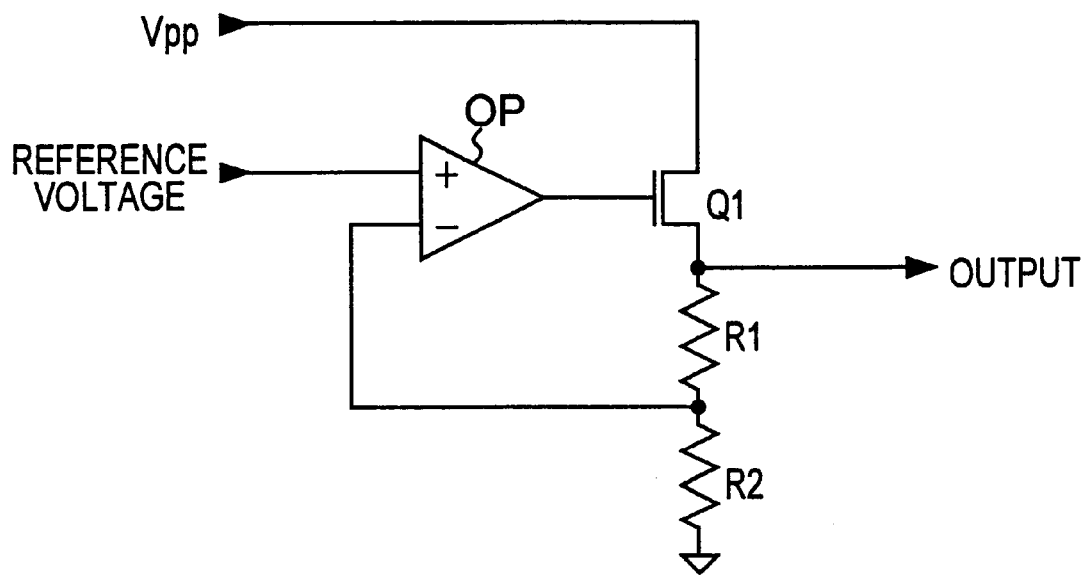
FIG. 5 is a specific circuit diagram of a regulator circuit shown in FIG. 3.
Figure 6:
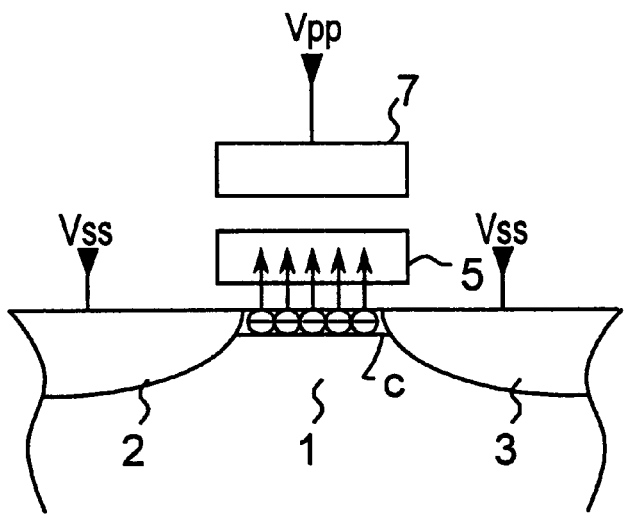
FIG. 6 is a schematic view showing a state of write to the memory cell shown in FIG. 4.
Figure 7:
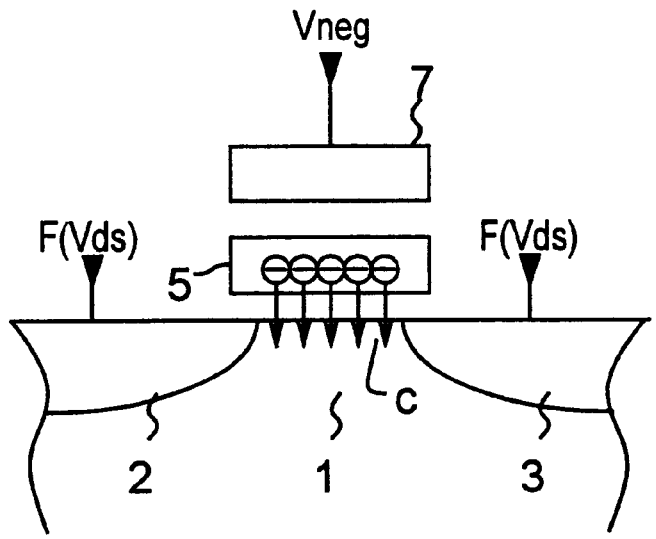
FIG. 7 is a schematic view showing a state of erase to the memory cell shown in FIG. 4.
Figure 8:
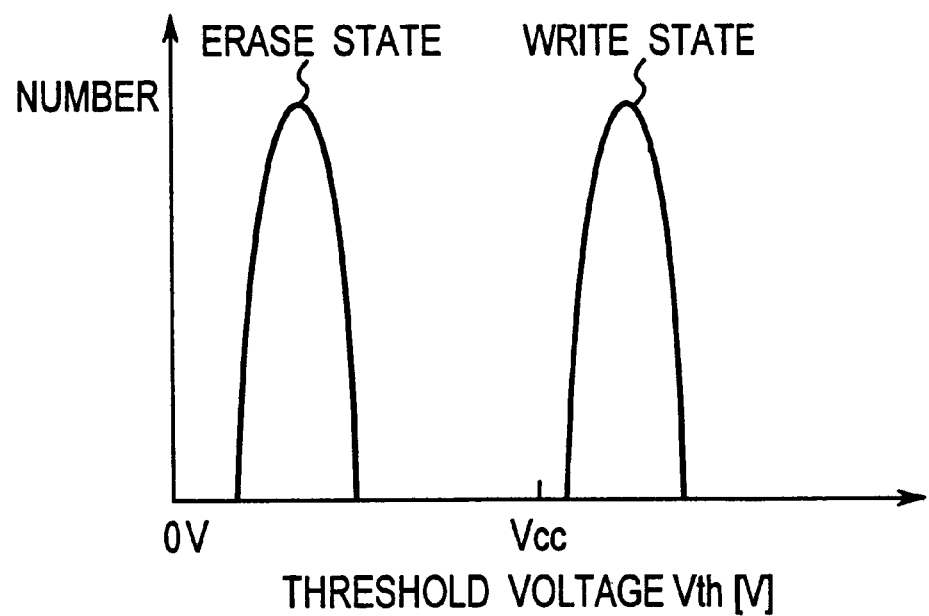
FIG. 8 is a view showing a distribution of threshold voltages in the erase state and the write state of the memory cell.

In FIG. 1, "SUB" is a substrate signal applied to the semiconductor substrate 1 shown in FIG. 4, which signal is generated by the regulator circuit 13 and applied by the erasing circuit 19 shown in FIG. 3. With reference to FIGS. 3 and 9, "SSG" is a source select gate signal applied to each gate of the select transistor ST2, which signal is generated and applied by the source sg circuit 21. "DSG" is a drain select gate signal applied to each gate of the select transistor ST1, which signal is generated and applied by the drain sg circuit 20. "BL" is a bit signal line applied to the main bit line BL, which signal is generated by the regulator circuits 13 and 14, and applied by the column decoder 17. "CSL" is a source line signal applied to the common source line CSL, which signal is generated by the regulator circuit 13, and applied by the erasing circuit 19. "WL" is a word line signal applied to the word line WL, which signal is generated and applied by the row decoder 18. "CPO" is a main bit line discharge signal applied to each gate of the main bit line discharge transistor CP.

Hereinbelow, the erasing sequence will be described in detail. First, the level of the main bit line discharge signal CPO is set at a voltage Vss. Consequently, the main bit line discharge transistor CP is put into a sate of OFF, and the main bit line BL is put into a state of floating.

Next, the levels of the source select gate signal SSG and the drain select gate signal DSG are set at an intermediate voltage Vleg (Vth<Vleg<(Vds+Vth)). After that, the level of the substrate signal SUB to be applied to the semiconductor substrate 1 is set at the voltage Vds, and the level of the source line signal CSL is set at the voltage Vds. Consequently, current flows from the p-type semiconductor substrate 1 to the N-type drain 3 and source 2 due to p-n forward bias, so that the local bit line LBL and the local source line LSL are charged.

As a result, voltage of the local bit lines LBL0 to LBLm connected to each drain 3 of the memory cells M00 to Mnm and voltage of local source lines LSL0 to LSLm connected to each source 2 thereof are raised up to Vds. Further, to the source select gate signal line SSG and the drain select gate signal line DSG, there are applied a source select gate signal SSG and a drain select gate signal DSG having the intermediate voltage Vleg lower than a voltage (Vds+Vth) and higher than a voltage Vth. It is noted that a method for setting an appropriate voltage value of the Vleg will be described later. Consequently, the select transistors ST10 to ST1m and the select transistors ST20 to ST2m are put in a half-conducting state as if with constant conductance. Accordingly, the common source line CSL and the local source lines LSL0 to LSLm are put in a half-conducting state, while at the same time, the main bit lines BL0 to BLm and the local bit lines LBL0 to LBLm are put in a half-conducting state.

Figure 2:
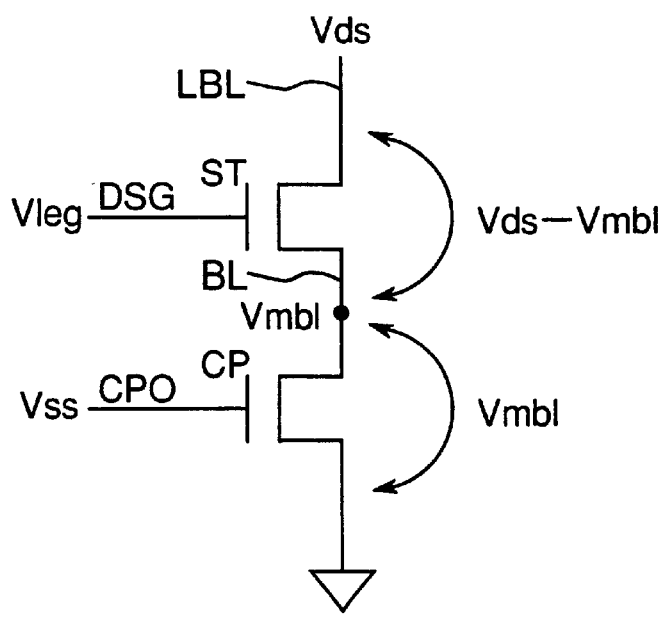
FIG. 2 is a view showing main part of a memory cell array of the nonvolatile semiconductor memory device according to the present invention with respect to the erasing operation.

Consequently, as shown in FIG. 2 showing a main part extracted from FIG. 9, the main bit line BL in a floating state is gradually charged from the local bit line LBL with voltage raised to as high as Vds. The voltage Vmbl, therefore, is raised up to Vleg−Vth(ST) conforming to the voltage between the source and the gate that cuts off the select transistor ST1.

Furthermore, the level of all the word lines WL are set at the voltage Vneg for erasing time tE. Since the negative voltage Vneg is applied to the control gate 7 of the memory cell M and potential of the source 2 and the drain 3 thereof is close to the value of the voltage Vds, there are generated high electric fields between the source 2 and the floating gate 5, between the drain 3 and the floating gate 5 and between the channel region c and the floating gate 5 in all the memory cells M, thereby causing electrons being pulled from the floating gate 5. At the same time, holes inside the channel region c are injected into the tunnel oxide 4 and the floating gate 5, which decreases threshold voltage. Thus, in the erasing sequence in the present embodiment, normal erasing operation can be carried out.

Further, in the erasing sequence, putting the select transistors ST1, ST2 in a half-conducting state makes potential difference between the drain and the source of the select transistors ST1, ST2 equal to (Vds−Vmbl) i.e. (Vds)−(Vleg−Vth)), as shown in FIG. 2. Also, potential difference between the drain and the source of the main bit line discharge transistor CP is, as shown in FIG. 2, equal to Vmbl=Vleg−Vth (Vleg<(Vds+Vth)). It indicates that potential difference between the drain and the source of the transistors ST1, ST2 and CP can be set lower than Vds in the cases of the conventional first and second erasing sequences.

These three groups of transistors, that is, the select transistors ST1, ST2, and the main bit line discharge transistor CP have been generally given shorter gate length for lowering a value of resistance in passing of current. Consequently, the transistors have been susceptible to stress due to low withstand voltage between the source and the drain thereof. However, according to the erasing sequence in the present embodiment, potential difference between the drain and the source are set low, which makes it possible to reduce possibility of affecting reliability.

The gate voltage Vleg of the select transistors ST1, ST2 should be so given that a voltage Vmbl applied to the main bit line BL satisfies the conditions of formulas (1) and (2) shown below:

$$Vds-Vmbl<Vk(ST) \quad (1)$$

$$Vmbl<Vk(CP) \quad (2)$$

where Vk(ST) is maximum withstand voltage of the select transistors ST1, ST2, and where Vk(CP) is maximum withstand voltage of the main bit line discharge transistor CP.

Most preferably, the gate voltage Vleg is a value obtained by equally allotting voltage load of the voltage Vds to the select transistors ST1, ST2 and the main bit line discharge transistor CP.

When the threshold voltage of the select transistors ST1, ST2 is Vth, it can be expressed that Vmbl=Vleg−Vth. Consequently, the range of the gate voltage Vleg based on the formulas (1) and (2) can be obtained from the following formula (3):

$$Vk(CP)+Vth>Vleg>Vds-Vk(ST)+Vth \quad (3)$$

It is noted that the nonvolatile semiconductor memory device in the present embodiment is basically identical to the nonvolatile semiconductor memory device shown in FIG. 3. However, there is some difference in the point that the high voltage pump 11 boosts up to the positive voltage Vleg instead of the voltage Veg so as to generate the voltage Vleg applied to each gate of the select transistors ST1, ST2m. In erasing operation, the high voltage pump 11 raises the voltage Vcc to the positive voltage Vleg, which is outputted to the drain sg circuit 20 that generates a drain select gate signal DSG to the drain select gate signal line DSG and to the source sg circuit 21 that generates a source select gate signal SSG to the source select gate signal line SSG. In that case, the voltage Vleg is definitely lower than the voltage Veg, which makes it possible to reduce power consumption of the high voltage pump 11 compared with the conventional case in which raising to the voltage Veg is executed.

As described above, in the present embodiment, the high voltage pump 11 raises a voltage to the positive voltage Vleg that is lower than the voltage Veg and outputs the voltage to the drain sg circuit 20 and the source sg circuit 21. When batch erase is executed, first, the main bit line discharge transistor CP is put in an OFF state, and the main bit line BL is put in a floating state. Next, the levels of the source select gate signal SSG and the drain select gate signal DSG are set at the intermediate voltage Vleg (Vth<Vleg<(Vds+Vth)) so that the select transistors ST1, ST2 are in a half-conducting state with constant conductance. Thereby, the common source line CSL, the local source line LSL, the main bit line BL, and the local bit line LBL are put in a half-conducting state. Then, the level of the substrate signal SUB to be applied to the semiconductor substrate 1 is set at the voltage Vds, and the level of the source line signal CSL is set at the voltage Vds.

Thus, voltage of each local bit line LBL and local source line LSL is raised to Vds, the main bit line BL in a floating state is charged, and the voltage Vmbl is made equal to "Vleg−Vth(ST)". The level of all the word lines WL is set to be the voltage Vneg for erasing time tE. Thereby, electrons are pulled from the floating gate 5, and at the same time holes inside the channel region c are injected into the tunnel oxide 4 and the floating gate 5. Thus, the threshold voltage is decreased and erasing is executed.

In that case, potential difference between the drain and the source in the select transistors ST1, ST2 is equal to (Vds−Vmbl). Potential difference between the drain and the source in the main bit line discharge transistor CP is equal to Vmbl=(Vleg−Vth)(Vleg<(Vds+Vth)). Therefore, potential difference between the drain and the source of the transistors ST1, ST2 and CP may be set lower than Vds in the conventional first erasing sequence and the second erasing sequence.

Accordingly, in the present embodiment, stress exerted on the main bit line discharge transistor CP and the select transistors ST1, ST2 can be reduced, resulting in increased reliability of the nonvolatile semiconductor memory device. Furthermore, voltage to be raised in the high voltage pump 11 is set lower, thereby reducing power consumption.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A method for driving a nonvolatile semiconductor memory device having:
   a memory cell array where memory cells are disposed in a matrix configuration, the memory cell composed of a floating-gate metal oxide semiconductor transistor including: a source and a drain formed on a surface of a semiconductor substrate; a floating gate formed on the source, the drain and a channel region between the source and the drain through a tunnel oxide; and a control gate formed on the interlayer insulating film through an interlayer insulating film,
   a word line shared for connecting control gates of the memory cells in a same row;
   a local bit line shared for connecting drains of the memory cells in a same column;
   a main bit line connected to the local bit line through a first metal oxide semiconductor transistor;
   a local source line shared for connecting sources of the memory cells in a same column;
   a common source line connected to the local source line through a second metal oxide semiconductor transistor; and
   a power line connected to the main bit line through a third metal oxide semiconductor transistor for supplying reference potential,
   the method, when erasing operation is executed, comprising the steps of:
     setting the third metal oxide semiconductor transistor to an OFF state for putting the main bit line in a floating state;

applying a first voltage to the semiconductor substrate so as to charge the local bit line to the first voltage;

setting the first metal oxide semiconductor transistor to a half-conducting state for making a voltage between a drain and a source of each of the first and third metal oxide semiconductor transistors lower than the first voltage; and applying a second voltage to the control gate through the word line so as to discharge electrons from the floating gate to the channel region through the tunnel oxide.

2. The method for driving the nonvolatile semiconductor memory device as defined in claim 1, wherein the step of setting the first metal oxide semiconductor transistor to the half-conducting state includes applying a third voltage to a gate of the first metal oxide semiconductor transistor to make the voltage between the drain and the source of the first metal oxide semiconductor transistor equal to or lower than a withstand voltage of the first metal oxide semiconductor transistor, and to make the voltage between the drain and the source of the third metal oxide semiconductor transistor equal to or lower than a withstand voltage of the third metal oxide semiconductor transistor.

3. The method for driving the nonvolatile semiconductor memory device as defined in claim 2, wherein the third voltage is higher than a voltage obtained by adding a threshold voltage of the first metal oxide semiconductor transistor to a voltage of the local bit line and further by subtracting the withstand voltage of the first metal oxide semiconductor transistor therefrom, and is lower than a voltage obtained by adding the threshold voltage of the first metal oxide semiconductor transistor to the withstand voltage of the third metal oxide semiconductor transistor.

* * * * *